US 7,825,748 B2

(12) United States Patent  (10) Patent No.: US 7,825,748 B2
Carpentier  (45) Date of Patent: Nov. 2, 2010

(54) INTEGRABLE TUNABLE FILTER CIRCUIT COMPRISING A SET OF BAW RESONATORS

(75) Inventor: Jean-Francois Carpentier, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 22 days.

(21) Appl. No.: 12/350,755

(22) Filed: Jan. 8, 2009

(65) Prior Publication Data

US 2009/0174503 A1  Jul. 9, 2009

Related U.S. Application Data

(62) Division of application No. 11/377,925, filed on Mar. 16, 2006, now Pat. No. 7,492,242.

(30) Foreign Application Priority Data

Mar. 18, 2005  (FR) .................................. 05 02706

(51) Int. Cl.
 *H03H 9/54* (2006.01)
(52) U.S. Cl. ........................ 333/188; 333/189; 333/190; 333/192
(58) Field of Classification Search ......... 333/187–190, 333/191–192
See application file for complete search history.

(56) References Cited

U.S. PATENT DOCUMENTS 3,697,903 A  10/1972  Sauerland ..................... 333/72

(Continued)

FOREIGN PATENT DOCUMENTS

DE  10234685  2/2004

(Continued)

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisbon, Portugal, Sep. 7-10, 1998, pp. 157-160.

(Continued)

*Primary Examiner*—Barbara Summons
(74) *Attorney, Agent, or Firm*—Lisa K. Jorgenson; E. Russell Tarleton; Seed IP Law Group PLLC

(57) ABSTRACT

A tunable filter circuit having inputs IN1-IN2 and outputs OUT1-OUT2, comprising at least a primary four-pole circuit including in cascade: a first varactor having a first electrode connected to IN1 and a second electrode; a first inductive resistor connected between the second electrode of the varactor and input IN2, a secondary four-pole circuit comprising four BAW resonators. First and second of these resonators have a first electrode connected to a first input of the secondary four-pole circuit and a second electrode connected to first and second outputs of the secondary four-pole circuit, respectively. Similarly, third and fourth of these resonators have a first electrode connected to a second input of the secondary four-pole circuit and a second electrode connected to the second and first outputs of the secondary four-pole circuit, respectively. The circuit further comprises a second inductive resistor connected in parallel to the first and second outputs of the secondary four-pole circuit and a second varactor having a first electrode connected to the first output of the secondary four-pole circuit and a second electrode for connecting a second primary four-pole circuit having the same structure. This allows realization of a particularly effective tunable filter circuit with only four inductive resistors.

20 Claims, 8 Drawing Sheets

U.S. PATENT DOCUMENTS

| | | | | |
|---|---|---|---|---|
| 3,731,230 | A | * | 5/1973 | Cerny, Jr. .................. 331/116 R |
| 5,036,299 | A | | 7/1991 | Dick et al. .................... 331/25 |
| 5,043,681 | A | | 8/1991 | Tanemura et al. ........... 331/107 |
| 5,053,937 | A | * | 10/1991 | Blockl .......................... 363/16 |
| 5,235,640 | A | | 8/1993 | Devries et al. ................. 380/13 |
| 5,291,159 | A | * | 3/1994 | Vale ............................ 333/188 |
| 5,446,306 | A | | 8/1995 | Stokes et al. ................. 257/416 |
| 5,608,360 | A | | 3/1997 | Driscoll .................. 331/107 A |
| 5,714,917 | A | | 2/1998 | Ella et al. .................... 332/144 |
| 6,653,913 | B2 | | 11/2003 | Klee et al. ................... 333/188 |
| 6,876,056 | B2 | * | 4/2005 | Tilmans et al. ............... 257/528 |
| 6,917,789 | B1 | | 7/2005 | Moloudi et al. ................ 455/78 |
| 6,927,649 | B2 | * | 8/2005 | Metzger et al. .............. 333/133 |
| 6,950,639 | B2 | | 9/2005 | Gogolla et al. ............ 455/196.1 |
| 7,030,718 | B1 | | 4/2006 | Scherer ....................... 333/188 |
| 7,065,331 | B2 | | 6/2006 | Korden et al. ............. 455/150.1 |
| 7,135,940 | B2 | | 11/2006 | Kawakubo et al. .......... 333/17.1 |
| 7,183,640 | B2 | * | 2/2007 | Mazzochette et al. ........ 257/703 |
| 7,187,240 | B2 | | 3/2007 | Cathelin et al. ................. 333/2 |
| 7,218,181 | B2 | | 5/2007 | Razafimandimby et al. . 333/107 |
| 7,274,274 | B2 | | 9/2007 | Carpentier et al. ........... 333/188 |
| 7,345,554 | B2 | | 3/2008 | Cathelin et al. .............. 331/154 |
| 2001/0028277 | A1 | | 10/2001 | Northam ...................... 331/34 |
| 2004/0227578 | A1 | | 11/2004 | Hamalainen ................. 331/107 |
| 2005/0266823 | A1 | | 12/2005 | Cathelin et al. .............. 455/344 |

FOREIGN PATENT DOCUMENTS

| | | |
|---|---|---|
| FR | 2455816 | 11/1980 |
| FR | 2864726 | 7/2005 |
| FR | 2864728 | 7/2005 |
| FR | 2864729 | 7/2005 |
| FR | 2864733 | 7/2005 |
| GB | 615 841 | 1/1949 |
| JP | 10-294636 | 11/1998 |
| WO | 02/25813 | 3/2002 |
| WO | 2004/066495 | 8/2004 |

OTHER PUBLICATIONS

Bradley, P., et al., "A Film Bulk Acoustic Resonator (FBAR) Duplexer for USPCS Handset Applications," IEEE MTT-Symposium, pp. 367-370, 2001.

Carpentier, J. F., et al., "21.3—A SiGe:C BiCMOS WCDMA Zero-IF RF Front-End Using an Above-IC BAW Filter," IEEE International Solid-State Circuits Conference, pp. 394-395, 2005.

Carpentier, J. F., et al., "A Tunable Bandpass BAW-Filter Architecture and Its Application to WCDMA Filter," IEEE MTT-Symposium, pp. 221-224, 2005.

De Los Santos, H., FR MEMES Circuit Design for Wireless Communications, "5.3 Film Bulk Acoustic Wave Filters," Artech House, 2002, pp. Cover-IV and 163-167.

Gopinathan, V., et al., "Design Considerations for High-Frequency Continuous-Time Filters and Implementation of an Antialiasing Filter for Digital Video," IEEE Journal of Solid-State Circuits, vol. 25, No. 6, pp. 1368-1378, Dec. 1990.

Karsilayan, A., et al., "Automatic Tuning of Frequency and Q-Factor of Bandpass Filters Based on Envelope Detection," ISCAS '98, Proceedings of the 1998 IEEE International Symposium on Circuits and Systems, pp. 65-68, 1998.

Koroglu, M., et al., "A 1.9Ghz Image-Reject Front-End with Automatic Tuning in a 0.15µm CMOS Technology," in Proceedings of the IEEE Int'l. Solid State Circuits Conference, San Francisco, CA, Feb. 9-13, 2003, pp. 1-10.

Lakin, K. M., et al., "Improved Bulk Wave Resonator Coupling Coefficient for Wide Bandwidth Filters," IEEE Ultrasonics Symposium, pp. 827-831, 2001.

Li, D., et al., "Design Techniques for Automatically Tuned Integrated Gigahertz-Range Active LC Filters," IEEE Journal of Solid-State Circuits, vol. 37, No. 8, pp. 967-977, Aug. 2002.

Razafimandimby, S., et al., "Nouvelle Configuration de filtre RF accordable en frequence utilisant des resonateurs BAW pour une chaine de reception homodyne WCDMA," 6e Colloque TAISA 2005, 4 pages.

Razafimandimby, S., et al. "A Novel Architecture of a Tunable Bandpass BAW-filter for a WCDMA Transceiver," Analog Integr. Circ. Sig. Process, vol. 49, pp. 237-247, 2006.

Schmidhammer, E., et al., "Design Flow and Methodology on the Design of BAW Components," IEEE MTT-Symposium, pp. 233-236, 2005.

Tilhac, C., et al., "A Bandpass BAW-Filter Architecture with Reduced Sensitivity to Process Variations," IEEJ Analog VLSI Workshop 2005, 5 pages.

Ueda, M., et al., "High-Q Resonators Using FBAR/SAW Technology and their Applications," IEEE MTT-Symposium, pp. 209-212, 2005.

Vale, G., et al., "FBAR Filters at GHz Frequencies," Forty-Fourth Annual Symposium on Frequency Control, Westinghouse Electric Corp., IEEE, 1990, pp. 332-336.

* cited by examiner

INTEGRABLE TUNABLE FILTER CIRCUIT COMPRISING A SET OF BAW RESONATORS

CROSS REFERENCE TO RELATED APPLICATION

The present application is a divisional of and claims priority under 35 U.S.C. §120 from U.S. patent application Ser. No. 11/377,925, filed Mar. 16, 2006, now U.S. Pat. No. 7,492,242, issued Feb. 17, 2009, which is assigned to the same assignee as the present application and incorporated herein by reference in its entirety.

TECHNICAL FIELD

The present disclosure generally relates to electronics for processing analog signals, and more specifically but not exclusively to a tunable filter circuit comprising acoustic resonators.

BACKGROUND INFORMATION

The considerable development of mobile telephony with its latest enhancements requires the use of increasingly sophisticated tunable filters.

Considering in particular the Wideband Code Division Multiple Access (WCDMA) standard for the 3rd generation mobile telephony, based on 2.14 Ghz, it can be considered to realize bandpass-type filter circuits requiring the use of resonator circuits. But making such circuits using passive devices of the LC-type is particularly delicate and it is even more difficult to integrate such circuits into a semiconductor product.

Using SAW resonators is known, unfortunately, such resonators do not allow embedding in an integrated circuit.

It has been sought to integrate a BAW-type acoustic resonator in an integrated circuit, but manufacturing of such resonators is particularly difficult to control. French Patent Application No. 03 15480, filed on 29 Dec. 2003, describes how to realize a filter element comprising a BAW resonator.

However, combining independent filter elements in order to make a sophisticated filter circuit remains a delicate operation since it comprises combining a great number of components, in particular of inductive resistors, varactors, and BAW resonators.

In particular, all components, and more particularly inductive resistors, should have a high coefficient of quality. Moreover, it is important to make sure that inductive resistors are not mutually disrupting.

Generally, it would be desirable to reduce as much as possible the occupied surface in an integrated circuit. It is indeed current that a planar inductive resistor on a substrate of silicon occupies a surface about 400×400 micrometers. It is clear that a great number of inductive resistors is then crippling to integrated circuit manufacturing.

Indeed, it is pointed out that the typical size of a BAW resonator is about 150×150 micrometers.

BRIEF SUMMARY OF THE INVENTION

The purpose of an embodiment of the invention is to solve the above-described problems.

The purpose of an embodiment of the present invention is to provide a tunable filter circuit optimized for embedding in a semiconductor product.

Another embodiment of this invention provides a tunable filter circuit comprising varactor circuits, inductive resistors and BAW-type resonators arranged in a particularly optimized way in order to reduce cluttering in a semiconductor product while allowing high performances.

Another embodiment of this invention provides a tunable filter circuit, comprising BAW-type resonators, particularly adapted to the realization of a mobile phone.

One embodiment of the invention provides a tunable filter circuit comprising first and second inputs and first and second outputs.

The circuit comprises at least a primary four-pole circuit including, in cascade:
  a first varactor having a first electrode connected to said first input and a second electrode;
  a first inductive resistor having a first electrode connected to the second electrode of the first varactor and having a second electrode connected to the second input;
  a secondary four-pole circuit comprising first, second, third and fourth BAW-type resonators.
  a second inductive resistor connected in parallel to both outputs of the secondary four-pole circuit;
  a second varactor having a first electrode connected to the first output of said secondary four-pole circuit, and a second electrode.

The secondary four-pole circuit is assembled in such a way that the first and second resonators have a first electrode connected to the first input of the secondary four-pole circuit, and a second electrode connected to first and second outputs of the secondary four-pole circuit, respectively. Similarly, the third and fourth resonators have a first electrode connected to the second input of the secondary four-pole circuit and a second electrode connected to the second and first outputs of the secondary four-pole circuit, respectively.

Such a circuit that requires only two inductive resistors and allows realization of a particularly effective filtering unit when the inductive resistors values are chosen so as to correspond to BAW resonator parallel resonant frequencies.

Indeed, in this case, thanks to the capacitive adjustment element made up by these varactors, a particularly effective filter, which is close to a resonant LC unit having four inductive resistors, is obtained, with only with two inductive resistors.

Thus, considerable surface is saved inside a semiconductor product.

Moreover, it can be noted that the circuit can be easily embedded in several distinct substrates, and in particular in a substrate of IPAD-type ensuring good quality performance for passive devices and in a silicon-type substrate allowing the realization of varactors.

In one embodiment, the circuit is made up of a cascade comprising a first capacitor in parallel, a first primary four-pole circuit, a second capacitor in parallel, a second primary four-pole circuit identical to the first primary four-pole circuit and finally a third capacitor in parallel.

Thus, with only four inductive resistors, a particularly efficient filter circuit is obtained, whose frequency can also be tuned.

In one embodiment, both primary four-pole circuits will be connected in order to form a differential structure.

In an embodiment, inductive resistors are provided on an IPAD-type substrate whereas varactors are on a silicon substrate; BAW resonators being on a distinct substrate.

An embodiment of the invention also allows the realization of an acoustic resonant circuit meant to be embedded in a semiconductor product comprising a BAW-type resonator having first and second resonant frequencies, characterized in that it comprises:

a first substrate, of the IPAD-type, on glass comprising an inductive resistor for canceling said second resonant frequency a second substrate comprising a capacitive adjustment element allowing to tune said resonator to said first resonant frequency.

In an embodiment, the capacitive adjustment element is an active component (such as a diode or MOS transistor).

BRIEF DESCRIPTION OF THE SEVERAL VIEWS OF THE DRAWINGS

Other features of one or more embodiments of the invention will be made clear when reading the following description and drawings, only given by way of nonrestrictive examples. In the accompanying drawings.

DETAILED DESCRIPTION

Embodiments of an integrable tunable filter circuit comprising a set of BAW resonators are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
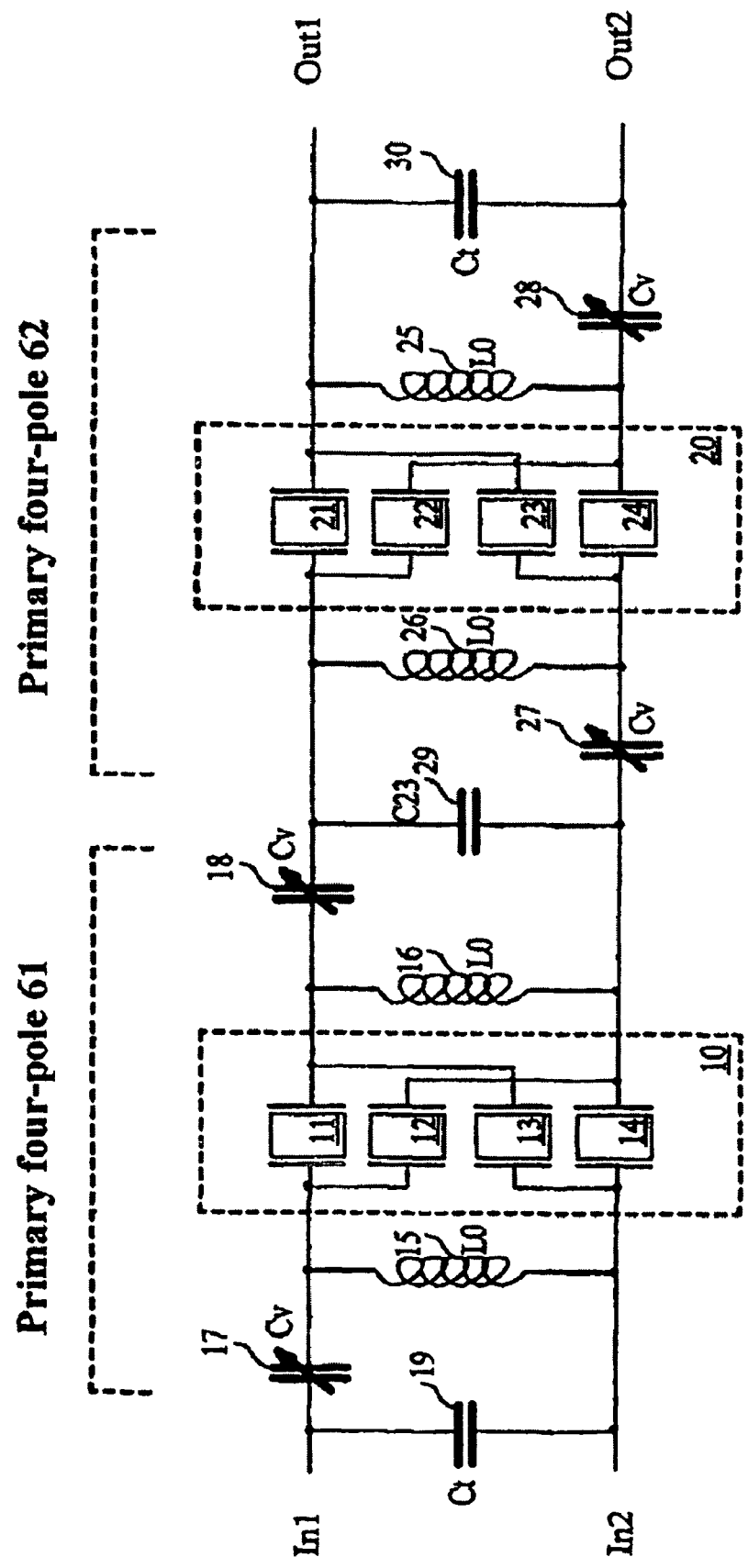
FIG. 1 illustrates the schematic circuit diagram of a filter circuit in accordance with an embodiment the present invention, having a differential structure.

FIG. 1 shows the architecture of a tunable filter circuit, in accordance with one embodiment of the present invention, which has a differential structure. The circuit is particularly adapted to the realization of a filter circuit for a UMTS 3G mobile phone, allowing extraction of the various channels that compose the available emission and/or reception band. It is only one example of realization and people qualified in the art will be able to adapt the teachings of the invention to realize any other tunable filter circuit.

The filter circuit according to one embodiment of the present invention is based on a parallel capacitor 19, a first primary four-pole circuit 61, a parallel capacitor 29, a second primary four-pole circuit 62 and a third parallel capacitor 30, in cascade.

Each primary four-pole circuit is based on a secondary four-pole circuit (resp. 10 or 20) composed of four resonators of the BAW-type (Bulk Acoustic Resonator). As it is known, BAW-type resonators are arranged within a volume delimited between a bottom electrode (B) and a top electrode (T) so that the acoustic wave develops in said volume.

As can be seen in FIG. 1, the first secondary four-pole circuit 10 has first and second inputs that are connected to a first electrode (of type T) of a first BAW resonator 11 and to a first electrode (of type T) of a second BAW resonator 14, respectively. The secondary four-pole circuit 10 also has first and second outputs that are respectively connected to a second electrode (B) of resonator 11 and to a second electrode (B) of resonator 14.

Secondary four-pole circuit 10 further has a third BAW resonator 13 having a first electrode (T) connected to the second input and a second electrode (B) connected to the first output.

Secondary four-pole circuit 10 finally has a fourth BAW resonator 12 having a first electrode (T) connected to the first input of four-pole circuit 10 and a second electrode (B) connected to the second output of four-pole circuit 10.

The structure of secondary four-pole circuit 20 is exactly similar to the structure of secondary four-pole circuit 10, resonators 11, 12, 13 and 14 being simply replaced by resonators 21, 22, 23 and 24, respectively. Therefore, connection of these resonators will not be further detailed.

As can be seen in FIG. 1, the filter circuit according to one embodiment of the invention comprises first and second inputs noted IN1 and IN2 respectively.

First input IN1 is connected to a first electrode of first capacitor 19 ($C_t$) and to a first electrode of a first varactor 17 ($C_v$). Varactor 17 has a second electrode connected to a first electrode of a first inductive resistor 15 ($L_0$) and connected to the first input of four-pole circuit 10. Second input IN2 is connected to a second electrode of capacitor 19, to the second electrode of inductive resistor 15 and to the second input of four-pole circuit 10.

The first output of four-pole circuit 10 is connected to a first electrode of a second inductive resistor 16 ($L_0$) and to a first electrode of a second varactor 18 ($C_v$). Varactor 18 has a second electrode that is connected to a first electrode of second capacitor 29 (C23), to a first electrode of a third inductive resistor 26 ($L_0$) and to the first input of second four-pole circuit 20.

The second output of four-pole circuit 10 is connected to the second electrode of inductive resistor 16, to the second electrode of capacitor 29 and to a first input of a third varactor 27 ($C_v$). Varactor 27 has a second electrode connected to the second electrode of inductive resistor 26 and to the second input of four-pole circuit 20.

The first output of four-pole circuit 20—which is also the first output OUT1 of the filter circuit—is connected to a first electrode of a fourth inductive resistor 25 ($L_0$) and to a first electrode of third fixed capacitor 30 ($C_t$)

The second output of four-pole circuit 20 is connected to the second electrode of inductive resistor 25 and to a first input of a fourth varactor 28 ($C_v$). Varactor 28 has a second electrode connected to the second electrode of capacitor 30 and to output OUT2 of the filter circuit.

Figure 2:
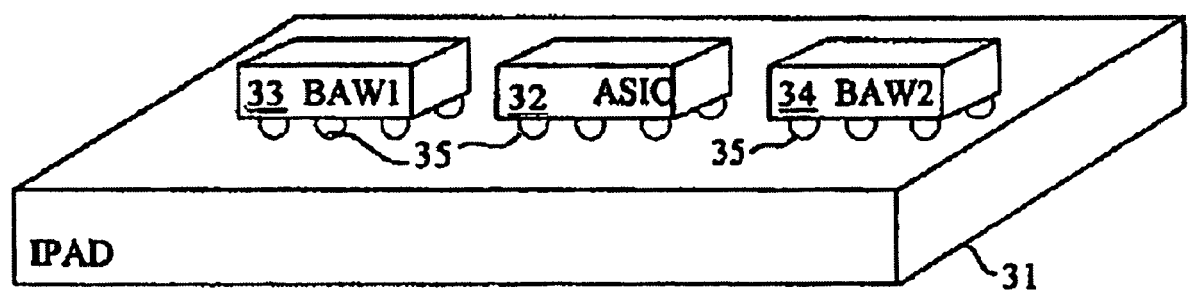
FIG. 2 illustrates an embodiment of the filter circuit, based on an IPAD-type substrate, a substrate for BAW resonators and a silicon substrate for varactors.

With reference to FIG. 2, concrete realization of the filter circuit of FIG. 1, which has a very particular aptitude to embedding in a semiconductor product, will now be explained.

It is noted that the filter circuit comprises a first module made up of a first substrate 31 on which are arranged passive integrated circuits, in particular inductive resistors 15, 16, 25 and 26. Thus, components showing particularly high quality coefficients can be realized. In one embodiment, substrate 31 is carried out by means of a technology known as Integrated Passive Device Technology (IPAD). As it is known, this IPAD technology makes it possible to make passive devices provided on a glass substrate, and showing an excellent coefficient of quality. Therefore, the inductive resistors that are arranged on substrate 31 exhibit a high quality factor Q.

When an embodiment of the invention is applied to the realization of a filter circuit for mobile telephony, the already existing IPAD substrate can be advantageously used to produce the BALUN. Thus, without additional cost, it is possible to obtain a BALUN with very low insertion losses (~1 dB).

The filter circuit then comprises a second module composed of a substrate 32—typically a silicon substrate—on which electronic circuits realized using MOS-type or bipolar transistors, and varactors are arranged, thus allowing the realization of the previously described tunable filter. Substrate 31 comprises one or more substrates (the figure showing an example of two substrates 33 and 34) on which are arranged eight BAW resonators of the circuit of FIG. 1. A module-type assembly is thus obtained.

Flip-chip (tin-lead) connections 35 are used for connection between substrate 31 and substrates 32, 33 and 34.

The architecture illustrated in FIG. 2 can then be even flip-chipped on a dielectric substrate inside a body to realize the final semi product conduct. The constitution of such flip-chips is not part of this invention and will consequently not be further described.

As can be seen with topographies of substrates IPAD 31, ASIC 32 and BAW 33 and 34, the filter circuit of FIG. 1 allows an arrangement with a minimum number of flip-chip connections, while making it possible to clearly separate the location of the various components on their respective substrates. Thus, it is ensured that combination of inductive resistors with high quality coefficients, of effective BAW circuits and of varactors allowing adjustment of the filter circuit will be possible, which is a considerable advantage for realizing an efficient filter circuit.

Figure 3:
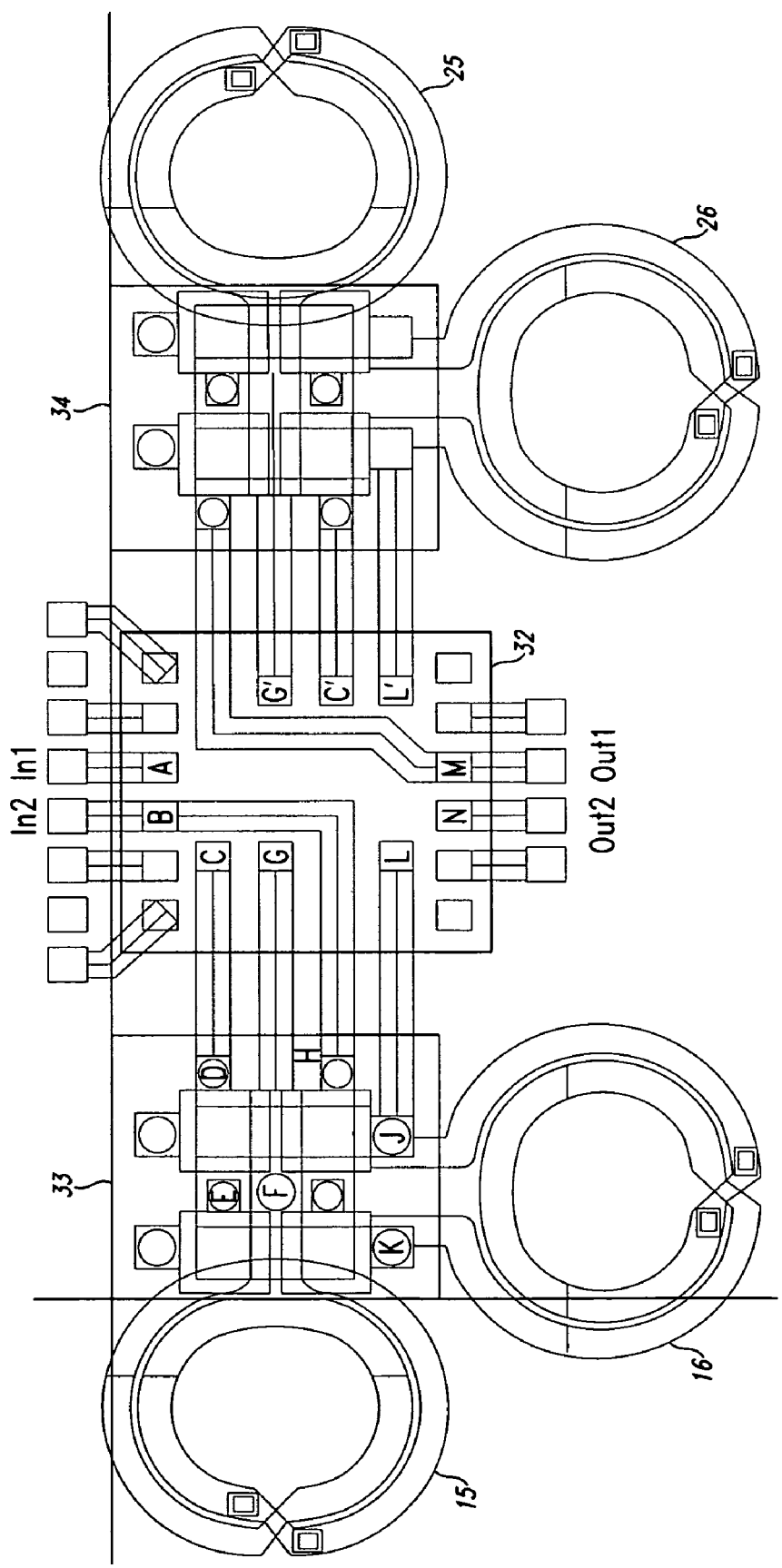
FIG. 3 illustrates an embodiment of an IPAD substrate in accordance with the present invention, allowing interfacing with two BAW substrates and one ASIC substrate.

With reference to FIG. 3, one embodiment of an IPAD substrate 31 in accordance with present invention will now be described. There are shown the four planar inductive resistors 15, 16, 25 and 26 of FIG. 1.

Moreover, the most important contact surfaces of the flip-chips for connection of substrates BAW 33 and 34 and for ASIC substrate 32 are illustrated.

The connections between IPAD substrate 31 and ASIC substrate 32 are mainly ensured by contact surfaces A, B, C, G, L, M, N, L', C' and G'.

In one embodiment, inputs IN1-IN2 and outputs OUT1-OUT2 are formed on IPAD substrate 31.

Signal IN1 (resp. IN2) arrives on contact surface A (resp. B) which makes it possible to offset it to ASIC substrate 32. Fixed capacitor 19 is provided on ASIC substrate 32 between surfaces A and B, and varactor 17 between contact surfaces A and C. The latter thus makes it possible to bring the electric signal back on IPAD substrate 31 and to carry it to surfaces D and E that ensure transmission to electrodes T of BAWs 11 and 12.

Figure 4:
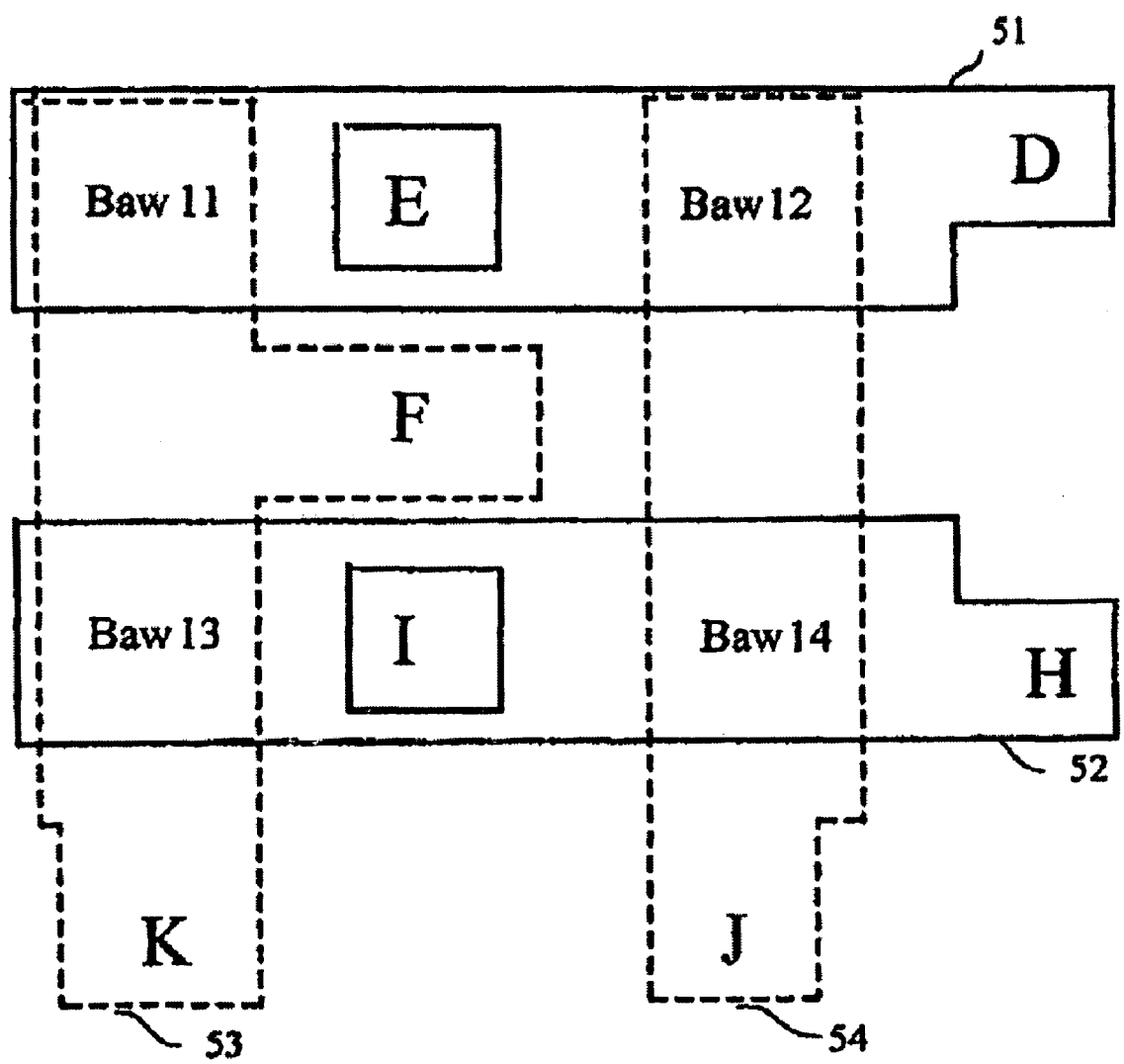
FIG. 4 illustrates an embodiment of the topography of the substrate meant to receive BAW components

FIG. 4 more specifically illustrates the structure of four-pole circuit 10 (being understood that the structure of four-pole circuit 20 will be identical). A first horizontal bar 51, located above the structure, allows connection of surfaces E and D to T-type (Top) electrodes of BAW resonators 11 and 12. A second horizontal bar 52 makes it possible to establish a connection between contact surfaces I and H the type-T electrodes of BAW resonators 13 and 14.

A third bar 53, located vertically and below horizontal bars 51 and 52, is used for bottom electrodes of BAW resonators 11 and 13, and for contact surfaces K and F. Similarly, a fourth vertical bar 54, also arranged below bars 51 and 52, realizes B-type electrodes of BAW resonators 12 and 14.

Referring back to the diagram of FIG. 4, the second electrode of varactor 17 is therefore connected, via contact surfaces C then D, to the top electrodes of BAW resonators 11 and 12. Contact surface E, which is arranged between the two vertical bars 53 and 54, allows a connection nearest to the first electrode of the inductive resistor 15, whose second electrode can be connected to substrate BAW 33 via surface I.

Second inductive resistor 16 is connected to substrate 33 via two contact surfaces K and J, the latter being also connected to contact surface L.

Input IN2 is connected via surface H to the top electrodes (T) of BAW resonators 13 and 14.

Both output signals of four-pole circuit 10, brought back to the IPAD substrate by means of contact surfaces F and J, are transmitted to contact surfaces G and L, respectively.

Contact surface G then makes it possible to bring back the signal output from the first four-pole circuit 10 to the first electrode of varactor 18 on the ASIC substrate, the second electrode of varactor 18 being connected to surface G' allowing signal transmission to second four-pole circuit 20.

Contact surface L makes it possible to transmit the voltage of the second left four-pole circuit 10 to the first electrode of varactor 27 on the ASIC substrate, the second electrode of varactor 27 being connected to surface L' in order to allow transmission of the signal to the second four-pole circuit.

The voltage of the first output of four-pole circuit 20 is transmitted via T electrodes of BAW resonators 21 and 23 to contact surface M, as can be seen in FIG. 4. The voltage appearing on the second output of four-pole circuit 20 is transmitted via contact surface C' to ASIC substrate 32 and is thereby connected to the first electrode of varactor 28, whose second electrode is connected to surface N that makes it possible to bring the output signal back on the IPAD substrate.

In an embodiment, ASIC substrate 32 also comprises capacitors 29 and 30, respectively connected between surfaces LG' and N-M.

As can be seen, the connection between IPAD substrate 31 and BAW substrate 33 is carried out by surfaces E, D, F, I, H, K and J while the connection between IPAD substrate 31 and ASIC substrate 32 is done via surfaces A, B, C, G, L, N and M.

Connections between IPAD substrate 31 and substrate BAW 34 are perfectly symmetrical to those existing for substrate 33. Only surfaces L', C' and G' are illustrated as they correspond to surfaces L, C and G that were shown for substrate BAW 32.

The filter circuit of an embodiment of the invention makes it possible to harmoniously distribute the various components between the IPAD substrate, BAW substrate(s) and the ASIC substrate, while requiring only a reduced number of flip-chip or connections.

This is a significant advantage of an embodiment of the invention.

It will now be shown that, with only four inductive resistors, the filter circuit carries out a sophisticated filtering function identical to a filter comprising eight inductive resistors.

Figure 5:
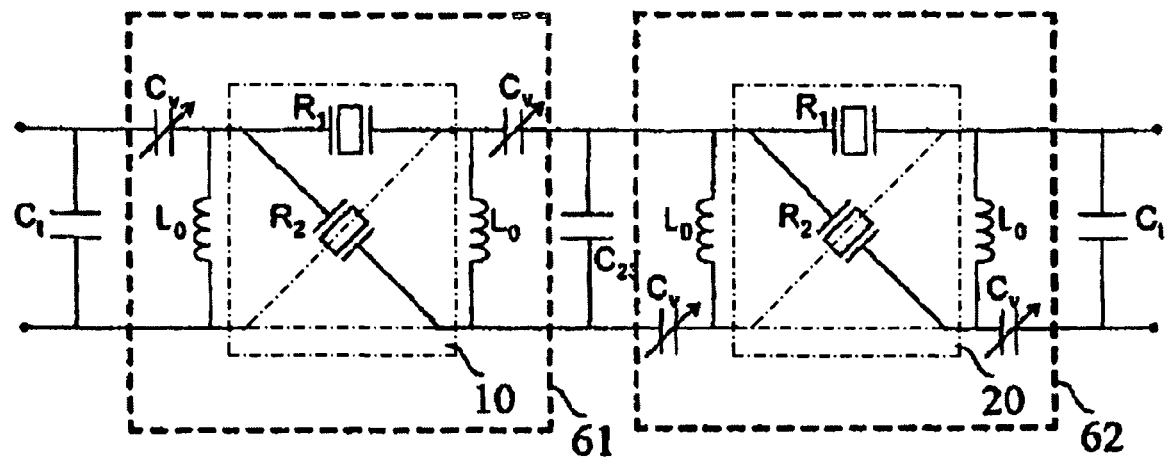
FIGS. 5 and 6 illustrate an example transformation of the filter circuit into an equivalent circuit comprising inductive resistors in parallel on each BAW resonator.
Figure 6:
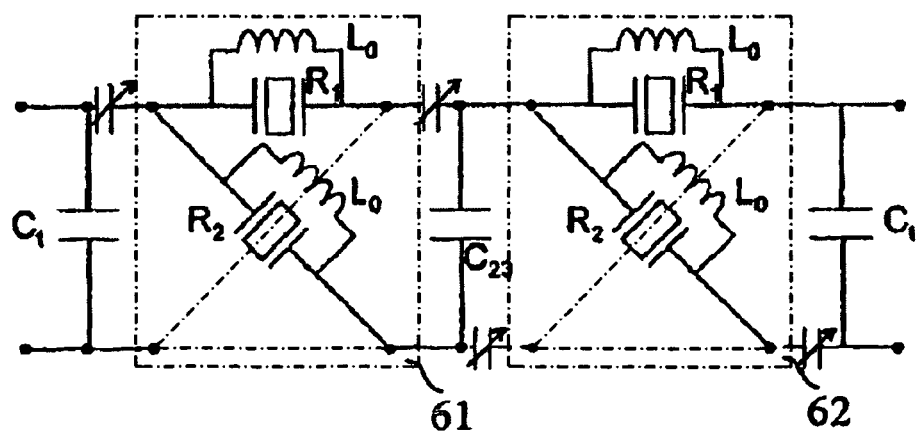

Indeed, considering the filter circuit of an embodiment of the invention, and referring again to FIG. 5, it can be observed that the circuit is made up by the following elements in cascade:

fixed capacitor $C_T$ a first primary four-pole filter circuit 61 comprising secondary four-pole circuit 10, capacitor $C_{23}$ a second primary four-pole filter circuit 62 comprising secondary four-pole circuit 20, associated to passive elements $C_v$ and $L_0$ Each primary four-pole circuit 61 or 62 can be represented in an equivalent form, such as illustrated in FIG. 6, where it can be seen that the inductive resistor of value $L_0$ identical to that of inductive resistors 15, 16, 25 and 26, is directly mounted in parallel with each BAW resonator.

Figure 7:
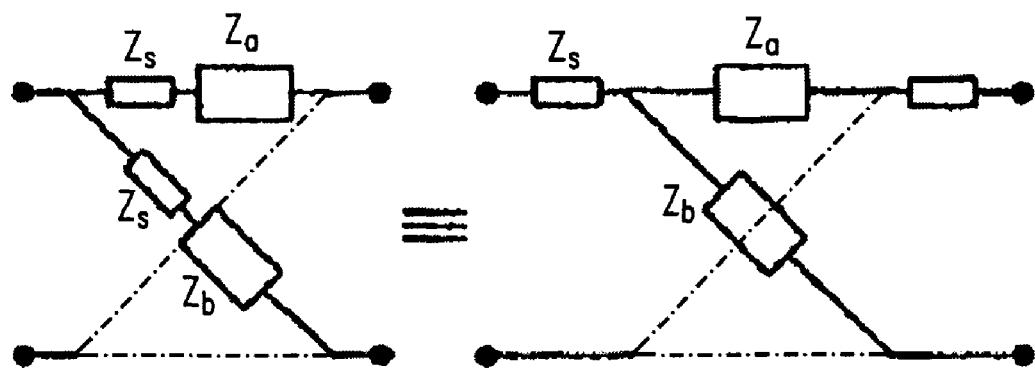
FIG. 7 illustrates a second example transformation leading to an equivalent diagram in which the varactor is in series within each arm of the four-pole circuit.
Figure 8:
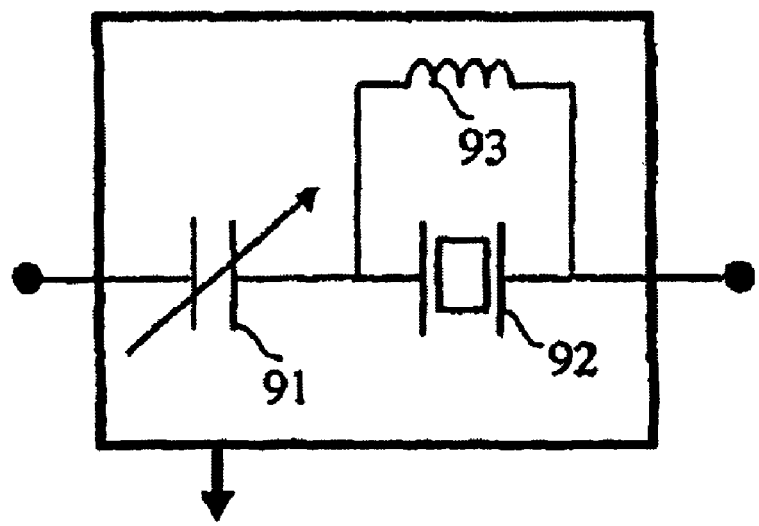
FIG. 8 illustrates the schematic circuit diagram of the basic element obtained with the filter circuit according to an embodiment of the invention.

It can also be shown, by means of a transformation illustrated in FIG. 7, that each four-pole circuit 61 and 62 can then be designed with a new equivalent electric diagram where each branch of the four-pole circuit can be replaced by an element, shown in FIG. 8, comprising a varactor 91 and a BAW resonator 92 in series, the BAW resonator comprising an inductive resistor 93 in parallel.

In the filter circuit according to an embodiment of the invention, inductive resistor 93 (of value $L_0$) is tuned so as to be resonating with the parallel capacity of the BAW resonator with which it is associated.

Figure 9A:
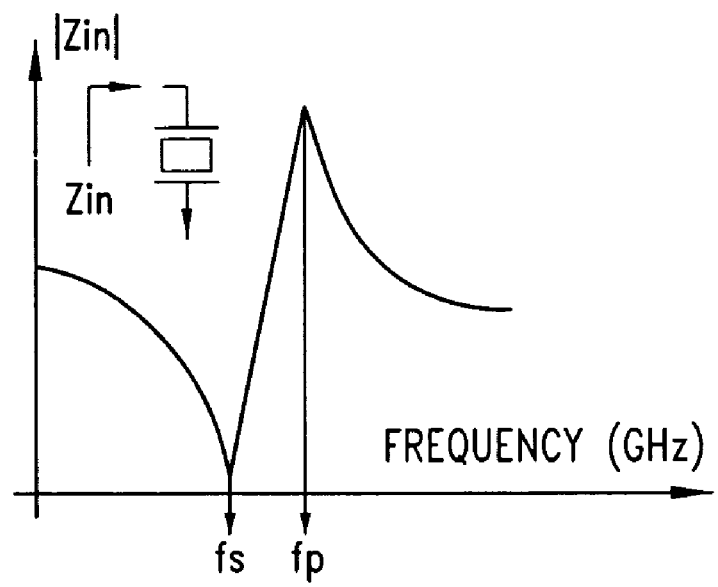
FIG. 9a points out the principle of both resonant frequencies of a BAW resonator, series and parallel.
Figure 9B:
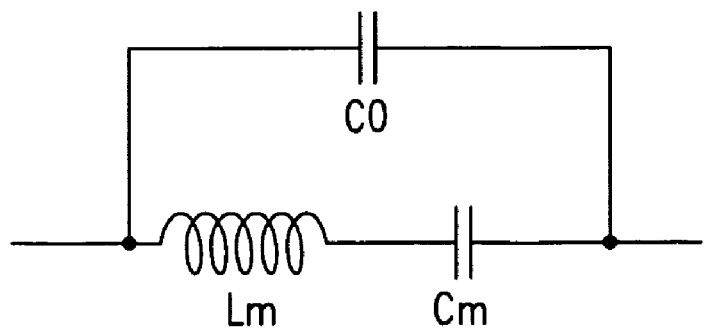
FIG. 9b illustrates the equivalent diagram of an embodiment of a BAW resonator.

An extremely significant result is then obtained. Indeed, the acoustic resonators have two very close resonant frequencies, respectively fs (series) and FP (parallel), as is illustrated in FIG. 9a. Referring to the equivalent electric diagram illustrated in FIG. 9b, it amounts to considering two resonant circuits of the LC-type, respectively series and parallel.

Typically, both resonant circuits are simultaneously used for filtering, as it is the case in document "RF MEMS Circuit Design for Wireless Communications", Hector J. De Los Santos, Artech House, ISBN 1-58033 329-9, 2002, p. 163 and following.

In an embodiment of the invention, the parallel frequency is canceled by means of an equivalent inductance (L0) selected in the vicinity of the parallel frequency. Then, the series frequency can be very simply acted upon to make the filter tunable.

Figure 10:
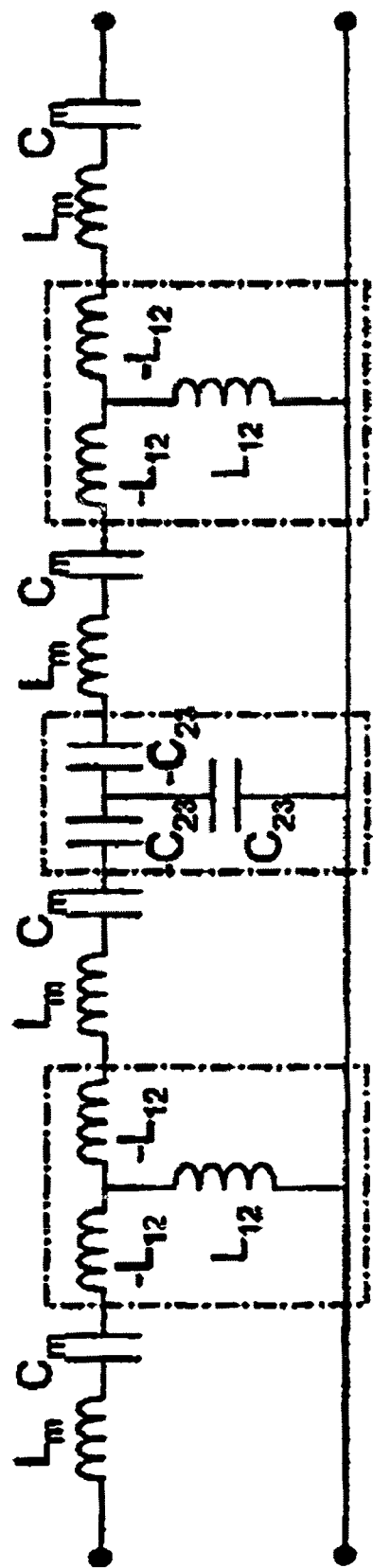
FIG. 10 shows a structure of a typical bandpass filter relating to an embodiment of the present invention.

This makes it possible to produce a complex filter, as illustrated in FIG. 10, by means of a circuit that is easy to manufacture.

It will be noted that a varactor is used to realize a capacitive adjustment element in one embodiment. This component being well known by people qualified in the art, its realization will not be further detailed therein. It could also be substituted by other capacitive adjustment element.

It will also be noted that fixed capacitors 19, 29 and 30 could be arranged on the IPAD instead of ASIC substrate 32.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An acoustic resonant circuit integrated in a semiconductor product including a bulk acoustic wave (BAW)-type resonator having first and second resonant frequencies, the acoustic resonant circuit comprising:

a first substrate, of an integrated passive device and active devices (IPAD)-type, made of glass, including an inductive resistor having first and second input terminals to cancel the second resonant frequency;

a second substrate including a first capacitive adjustment element to enable tuning of said resonator to said first resonant frequency; and a four-pole circuit having first and second input terminals respectively coupled to the first and second terminals of the inductive resistor and having first and second output terminals, the four-pole circuit including a first plurality of resonators that includes the BAW-type resonator;

an inductive element having first and second terminals respectively coupled to the first and second output terminals of the four-pole circuit; and a second capacitive adjustment element having a first terminal coupled to the first terminal of the inductive element and having a second terminal, wherein the first plurality of resonators have the second resonant frequency.

2. The circuit according to claim 1 wherein said first capacitive adjustment element is a varactor.

3. The circuit according to claim 1 wherein said second substrate is a silicon substrate.

4. The circuit according to claim 1, further comprising a third substrate that includes said BAW-type resonator.

5. The circuit according to claim 4, further comprising connections between said first, second, and third substrates.

6. The circuit according to claim 1, further comprising:

first and second filter input terminals;

wherein the first capacitive adjustment element having a first terminal coupled to the first filter input terminal and having a second terminal; and wherein said inductive resistor has a first terminal coupled to the second terminal of the first capacitive adjustment element and further has a second terminal coupled to the second filter input terminal.

7. An acoustic resonant circuit integrated in a semiconductor product, the resonant circuit comprising:

a resonator having first and second resonant frequencies;

a first substrate made of glass and including a first inductive element to cancel said second resonant frequency;

a second substrate including a capacitive adjustment element to enable to tune said resonator to said first resonant frequency;

electrical connections between said resonator, said first inductive element, and said capacitive adjustment element; and a first four-pole circuit having first and second input terminals respectively coupled to the first and second terminals of the first inductive element and having first and second output terminals, the first four-pole circuit including a first plurality of resonators that includes said resonator.

8. The circuit of claim 7 wherein said resonator is a bulk acoustic wave (BAW)-type resonator.

9. The circuit of claim 7 wherein said capacitive adjustment element is a varactor.

10. The circuit of claim 7 wherein said second substrate is a silicon substrate.

11. The circuit of claim 7, further comprising a third substrate that includes said resonator.

12. The circuit of claim 11 wherein said first, second, and third substrates are part of a flip-chip arrangement.

13. The circuit of claim 7, further comprising:
first and second filter input terminals;
wherein said capacitive adjustment element is a first capacitive adjustment element having a first terminal coupled to the first filter input terminal and having a second terminal;
wherein said first inductive element has a first terminal coupled to the second terminal of the first capacitive adjustment element and further has a second terminal coupled to the second filter input terminal;
a second inductive element having first and second terminals respectively coupled to the first and second output terminals of the first four-pole circuit; and
a second capacitive adjustment element having a first terminal coupled to the first terminal of the second inductive element and having a second terminal,
wherein the first plurality of resonators have said second resonant frequency.

14. An acoustic resonant circuit integrated in a semiconductor product including a bulk acoustic wave (BAW)-type resonator having first and second resonant frequencies, the acoustic resonant circuit comprising:
a first substrate, of an integrated passive device and active devices (IPAD)-type, made of glass, including an inductive resistor to cancel the second resonant frequency;
a second substrate including a capacitive adjustment element to enable to tune the resonator to the first resonant frequency;
first and second filter input terminals,
wherein the capacitive adjustment element is a first capacitive adjustment element having a first terminal coupled to the first filter input terminal and having a second terminal,
wherein the inductive resistor is a first inductive element having a first terminal coupled to the second terminal of the first capacitive adjustment element and having a second terminal coupled to the second filter input terminal;
a first four-pole circuit having first and second input terminals respectively coupled to the first and second terminals of the first inductive element and having first and second output terminals, the first four-pole circuit including a first plurality of resonators that includes the BAW-type resonator;
a second inductive element having first and second terminals respectively coupled to the first and second output terminals of the first four-pole circuit; and
a second capacitive adjustment element having a first terminal coupled to the first terminal of the second inductive element and having a second terminal,
wherein the first plurality of resonators have the second resonant frequency, and wherein the first and second inductive elements have an inductance in a vicinity of the second resonant frequency.

15. The circuit according to claim 14, further comprising a third substrate that includes the BAW-type resonator.

16. The circuit according to claim 15, further comprising connections between the first, second, and third substrates.

17. An acoustic resonant circuit integrated in a semiconductor product, the resonant circuit comprising:
a resonator having first and second resonant frequencies;
a first substrate made of glass and including an inductive resistor to cancel the second resonant frequency;
a second substrate including a capacitive adjustment element to enable to tune the resonator to the first resonant frequency;
electrical connections between the resonator, the inductive resistor, and the capacitive adjustment element;
first and second filter input terminals,
wherein the capacitive adjustment element is a first capacitive adjustment element having a first terminal coupled to the first filter input terminal and having a second terminal,
wherein the inductive resistor is a first inductive element having a first terminal coupled to the second terminal of the first capacitive adjustment element and having a second terminal coupled to the second filter input terminal;
a first four-pole circuit having first and second input terminals respectively coupled to the first and second terminals of the first inductive element and having first and second output terminals, the first four-pole circuit including a first plurality of resonators that includes the resonator;
a second inductive element having first and second terminals respectively coupled to the first and second output terminals of the first four-pole circuit; and
a second capacitive adjustment element having a first terminal coupled to the first terminal of the second inductive element and having a second terminal,
wherein the first plurality of resonators have the second resonant frequency, and wherein the first and second inductive elements have an inductance in a vicinity of the second resonant frequency.

18. The circuit of claim 17 wherein the resonator is a bulk acoustic wave (BAW)-type resonator.

19. The circuit of claim 17, further comprising a third substrate that includes the resonator.

20. The circuit of claim 19 wherein the first, second, and third substrates are part of a flip-chip arrangement.

* * * * *